(12) United States Patent
Horie et al.

(10) Patent No.: US 6,624,652 B2
(45) Date of Patent: Sep. 23, 2003

(54) CIRCUIT BOARD AND SYSTEM FOR TESTING THE SAME

(75) Inventors: Mikio Horie, Tokyo (JP); Ryoichi Nakanishi, Tokyo (JP)

(73) Assignee: Pentax Corporation, Tokyo (JP)

( * ) Notice: Subject to any disclaimer, the term of this patent is extended or adjusted under 35 U.S.C. 154(b) by 0 days.

(21) Appl. No.: 09/845,279

(22) Filed: May 1, 2001

(65) Prior Publication Data

US 2001/0039486 A1 Nov. 8, 2001

(30) Foreign Application Priority Data

May 2, 2000 (JP) ........................................ 2000-133120

(51) Int. Cl.[7] .......................... G01R 31/26; G01R 31/02
(52) U.S. Cl. ........................ 324/765; 324/760; 324/73.1
(58) Field of Search .............................. 324/73.1, 760, 324/765; 714/724, 726, 732, 734, 736; 702/57, 117, 118, 120, 122, 123

(56) References Cited

U.S. PATENT DOCUMENTS

| | | | | |
|---|---|---|---|---|
| 3,764,995 A | * | 10/1973 | Helf, Jr. et al. ............. 324/73.1 |
| 4,192,451 A | * | 3/1980 | Swerling et al. ............ 714/732 |
| 4,212,075 A | * | 7/1980 | Cleversey et al. .......... 324/73.1 |
| 4,312,066 A | * | 1/1982 | Bantz et al. ................. 714/726 |
| 4,354,268 A | * | 10/1982 | Michel et al. .............. 324/73.1 |
| 4,389,710 A | * | 6/1983 | Rasmussen .................. 714/734 |
| 4,744,084 A | * | 5/1988 | Beck et al. ................. 324/73.1 |
| 5,030,979 A | | 7/1991 | Kobayashi et al. |
| 5,063,383 A | * | 11/1991 | Bobba ........................ 324/73.1 |
| 5,543,727 A | * | 8/1996 | Bushard et al. ............. 324/760 |
| 6,043,669 A | * | 3/2000 | Carroll ........................ 324/761 |

FOREIGN PATENT DOCUMENTS

JP          2-941          1/1990

* cited by examiner

*Primary Examiner*—Kamand Cuneo
*Assistant Examiner*—Jermele Hollington
(74) *Attorney, Agent, or Firm*—Greenblum & Bernstein, P.L.C.

(57) ABSTRACT

The CPU of a test apparatus sends, to a subject test board, a test command containing an address in an address space where circuit blocks of the subject test board are mapped and a command code specifying an operation to be performed to the address. Test program executed by the CPU of the subject test board allow the CPU to extract the address and the command code included in the test command from the test apparatus and then to perform the operation specified by the command code to the address.

7 Claims, 10 Drawing Sheets

| NAME OF SUBJECT TEST BOARD | TEST STEP | OPERATION TYPE | ADDRESS | WRITE DATA |
|---|---|---|---|---|
| BOARD A | 1 ⋮ ⋮ $Z_1$ | WRITE ⋮ ⋮ READ | 0x00000000 ⋮ ⋮ 0x30000000 | |
| BOARD B | 1 ⋮ ⋮ $Z_2$ | WRITE ⋮ ⋮ READ | 0x0000001 ⋮ ⋮ 0x4000001 | |
| BOARD C | 1 ⋮ | WRITE ⋮ | 0x0001001 ⋮ | |

Fig. 9(a)

| COMMAND | CC | DA0 | DA1 | DA2 | DA3 | DS | WD0 | WD1 | WD2 | WD3 |
|---|---|---|---|---|---|---|---|---|---|---|
| BYTE ORDER | 1st | 2nd | 3rd | 4th | 5th | 6th | 7th | 8th | 9th | 10th |

Fig. 9(b)

| RESPONSE | CCE | DA0E | DA1E | DA2E | DA3E | DSE | RD0 | RD1 | RD2 | RD3 |
|---|---|---|---|---|---|---|---|---|---|---|
| BYTE ORDER | 1st | 2nd | 3rd | 4th | 5th | 6th | 7th | 8th | 9th | 10th |

CIRCUIT BOARD AND SYSTEM FOR TESTING THE SAME

BACKGROUND OF THE INVENTION

1. Field of the Invention

The present invention relates to a circuit board test system which includes a test apparatus and a circuit board for carrying out tests such as a confidence test of the circuit board, and to a circuit board which is capable of constituting such a circuit board test system.

2. Description of the Related Art

It is often required to determine whether the traces on a circuit board have been patterned as designed or the circuit blocks (circuit elements) implemented on the board will function as specified. This can be achieved through a determination of whether a predetermined output results from a predetermined port when a necessary stimulus is provided to the circuit board to cause the output to be generated from the port.

To carry out such tests, the following circuit board test systems have been conventionally employed. That is, available is one system in which a CPU for applying a test program is additionally mounted on a subject circuit board as well as the other system in which a CPU mounted to perform its inherent functions on a subject circuit board is allowed to apply a test program. Such a test program is stored beforehand in a ROM implemented on the subject circuit board and allows the CPU to successively write data (8-bit data, 16-bit data etc.) into logical addresses each assigned to a circuit block on the circuit board. Then, it is checked if the circuit board works properly in accordance with a determination of whether all data thus written have actually accepted by the circuit blocks mapped to the logical addresses. For example, if the circuit block is a memory, the test program causes the CPU to write the predetermined data to the logical address assigned to the memory. Then, the test program causes the CPU to read it and to compare the read data with the written data. If the two data match, it is determined that the circuit board (memory) works properly. As another example, if the circuit block is an output port, the test program then causes the CPU to write the predetermined data to the logical address assigned to the output port. Thus, if the written data is outputted from the output port, it is determined that the circuit board (output port) works properly.

Figure 11:
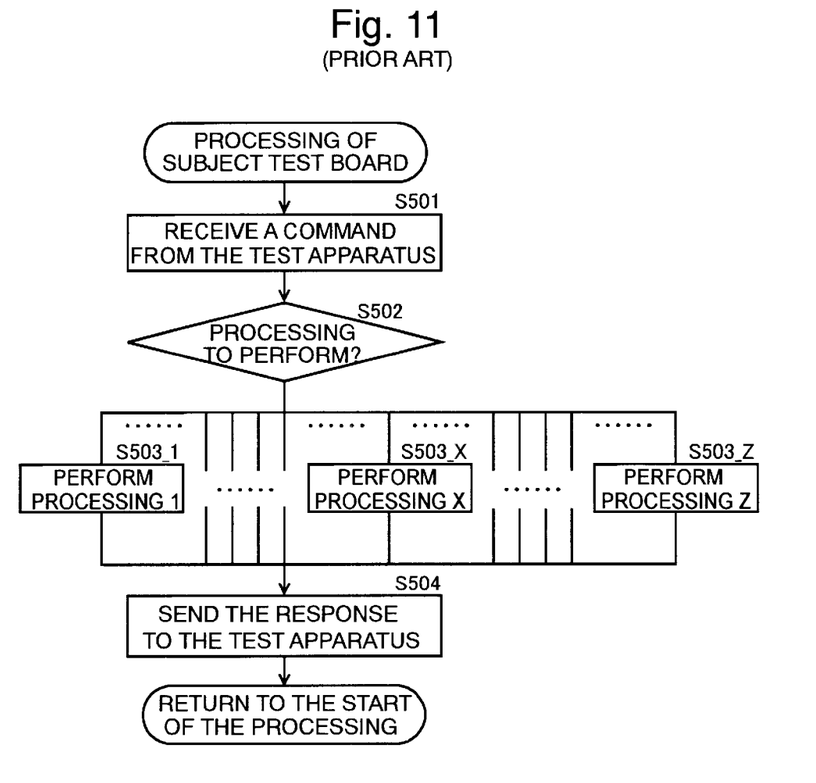
FIG. 11 is a flowchart illustrating an outline of the test program executed by the CPU on a subject test board in a conventional circuit board test system.

Conventionally, such a test program contains a multiple of processing modules each of which is for checking its own circuit block and is activated by an individual command. FIG. 11 is a flowchart outlining the logical flow of such a conventional test program. As shown in FIG. 11, in step S501 or the first step after having been activated, the test program waits for a command from a test apparatus connected to a subject test board and receives the command. After having received the command, the test program analyzes the command in step S502 and recognizes processing to be performed. Then, the test program performs the processing (processing 1 to processing Z) corresponding to the command in a step among step S503_1 to S503_Z. In any case, the test program sends a response including the processing result to the test apparatus in the next step S504 and then allows control to return to step S501.

Figure 12A:
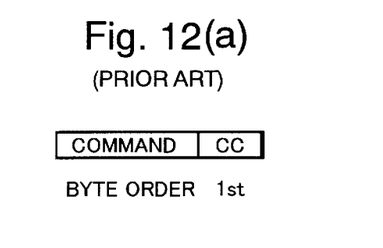
Figure 12B:
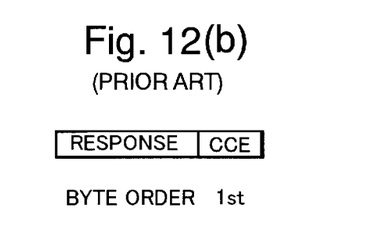

FIG. 12(a) shows the format of a test command for instructing a conventional test program to perform any processing and FIG. 12(a) shows the format of response data. As shown in FIG. 12(a), the test command consists of one byte of Command Code (CC). On the other hand, as shown in FIG. 12(b), the format of the response data corresponding to the test command consists of Response Data (RD) representative of success, failure or the like.

Figure 13:
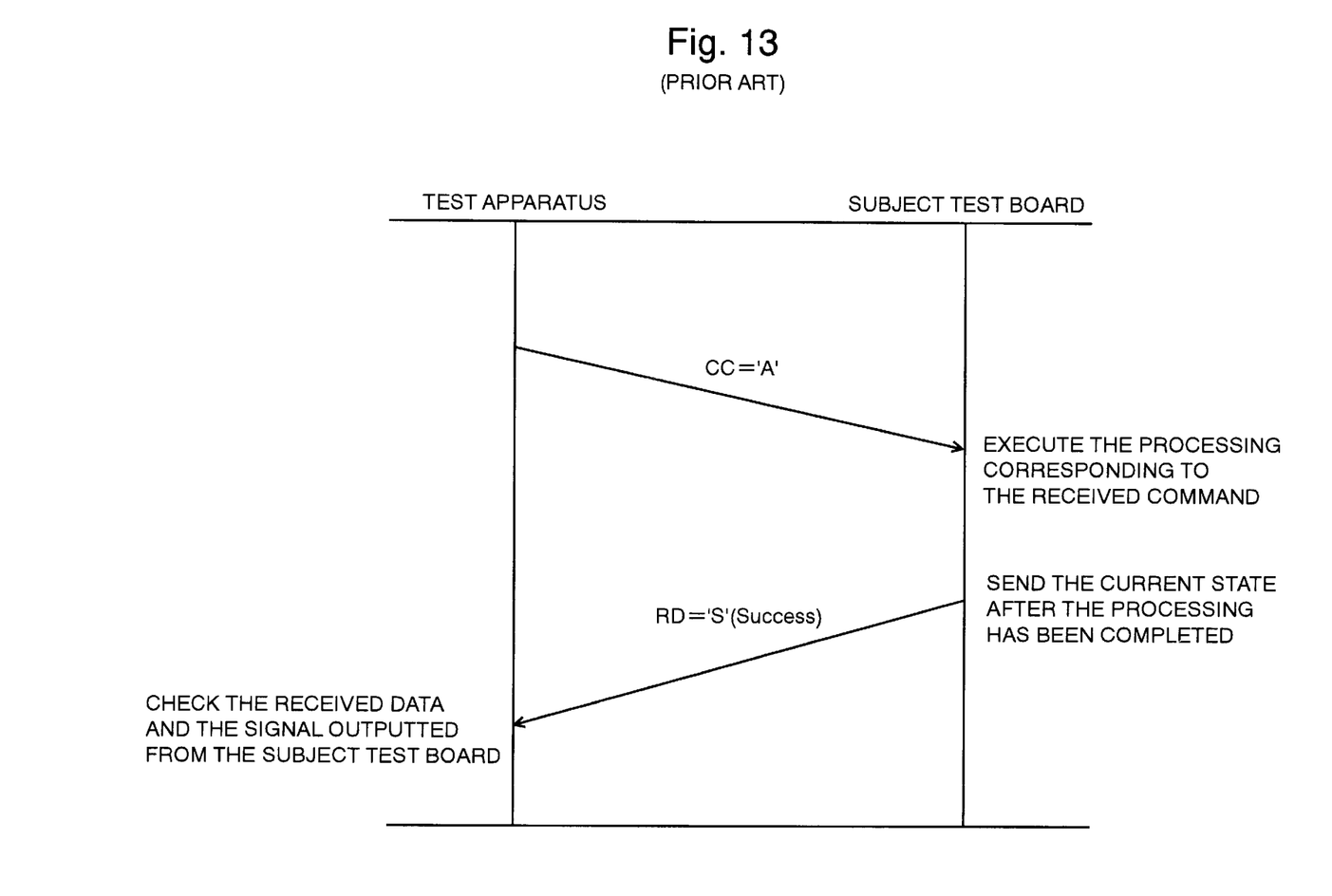
FIG. 13 is a sequence diagram illustrating information to be communicated between a test apparatus and the subject test board in the conventional circuit board test system.

For example, suppose CC=A is associated with the writing of data=0x01 to logical address=0x1000000. Under this condition, as shown in the sequence diagram of FIG. 13, when an operator (tester) of the test apparatus instructs a test apparatus to send a test command of CC=A to a subject test board in order to execute a test on the logical address= 0x10000000, the CPU that is provided on the subject test board and has read a test program executes the writing of data=0x01 to logical address=0x10000000 (step S503 in FIG. 11). After the writing has been completed, the CPU sends the response data of RD representative of the current state to the test apparatus. When the tester has been able to confirm that the test apparatus has received RD=S representative of success and that the data=0x01 has accepted by the circuit block mapped to logical address=0x10000000, the tester recognizes that the circuit board works properly with respect to the circuit block.

In addition, suppose CC=B is associated with the reading of the checksum of a ROM implemented on the subject test board. Under this condition, when the tester instructs the test apparatus to send a test command of CC=B to the subject test board, the CPU that has read the test program reads the checksum from the logical address where the checksum of the ROM is stored (step S503 in FIG. 11). After the reading has been completed properly, the CPU sends to the test apparatus the response data of RD representative of the checksum that has been read.

The aforementioned conventional circuit board test system, however, has presented the following problems. That is, since different circuit blocks are mapped to the address space in accordance with the type of individual circuit boards, the subject test boards of different configurations require test programs with the program codes combined differently. In addition, since such a test program organized differently for each subject test board is typically stored on the mask ROM implemented on the subject test board, it was impossible to make a change in or add a test item to the test program after the subject test board has been assembled. Furthermore, a subject test board to be tested on a wide range of test items would require a multiple of processing modules, thereby causing the volume of the entire test program to be significantly increased.

SUMMARY OF THE INVENTION

It is an object of the present invention to provide a circuit board test system with a general-purpose test program which is loaded on a subject test board and independent of the hardware configuration of the board, thereby allowing the size of the test program to be reduced and facilitating the change of the test items. It is another object of the present invention to provide a circuit board that can constitute such a circuit board test system.

A circuit board test system according to the present invention developed to achieve the aforementioned objects includes a subject test board having a controller and circuits mapped in an address space of the controller and implemented thereon, and a test apparatus for issuing a test command to the subject test board. The test apparatus includes a command generator part for generating a test command which specifies an address in address space and an operation to be performed to the address, and a command transmitter part for sending the test command generated by the command generator part to subject test board. The subject test board includes a command receiver part for receiving test command, a control part, and a storage part for storing a program to allow the control part to receive a test command via command receiver part and to perform the operation specified by the test command to the address specified by the test command.

With such a configuration, it is possible for the control part of the subject test board to operate data at various addresses in accordance with the contents of the test command sent from the test apparatus to the subject test board without changing the program codes stored in the storage part of the subject test board. Thus, even when the subject test board is to be tested on a wide range of test items, the volume of the program codes is made constant. In addition, it is not necessary to make the program codes to be adapted to the specification of the subject test board. This makes it unnecessary to modify the program codes even for an increase in type of the subject test board, an increase in test item, or a change in hardware configuration of the subject test board.

The circuit board test system according to the present invention may be realized by using the test apparatus including a command generator part which generates a test command that specifies an address in that address space and also specifies the operation is a write operation of particular data to the address. However, it is desirable to use the test apparatus including a command generator part which generates a test command that specifies an address in that address space and data with which a write operation to be performed to the address.

If this configuration is adopted, it is possible to use the program that allows, when received is the test command specifying the data to be written, the control part to write data specified by the test command to and then read the data from the address specified by the test command.

Moreover, the circuit board test system according to the present invention may be realized by using the test apparatus including a command generator part which generates a test command which specifies an address in address space and also specifies that the operation to be performed is a read operation.

Furthermore, in realizing the circuit board test system according to the present invention, it is desirable to create the program so that the control part sends the data having been read to the test apparatus.

A circuit board according to the present invention has a controller and circuits mapped in an address space of the controller and implemented thereon. The circuit board includes a command receiver part for receiving a test command specifying an address in the address space and an operation to be performed to the address. The circuit board also includes a control part, and a storage part for storing a program to allow the control part to receive a test command via the command receiver part and to perform the operation specified by the test command to the address specified by the test command.

Using this circuit board, it is possible to construct the circuit board test system according to the present invention.

BRIEF DESCRIPTION OF THE DRAWINGS

The invention will be described below in detail with reference to the accompanying drawings, in which:

FIG. 9($a$) is schematic diagram showing the format of a test command and response data;

FIG. 9($b$) is schematic diagram showing the format of response data;

FIG. 12($a$) is a schematic diagram showing the formats of a test command in the conventional circuit board test system;

FIG. 12($b$) is a schematic diagram showing response data in the conventional circuit board test system.

DESCRIPTION OF THE PREFERRED EMBODIMENTS

Now, an embodiment of the present invention will be explained below with reference to the drawings.

Configuration of a Circuit Board Test System

Figure 1:
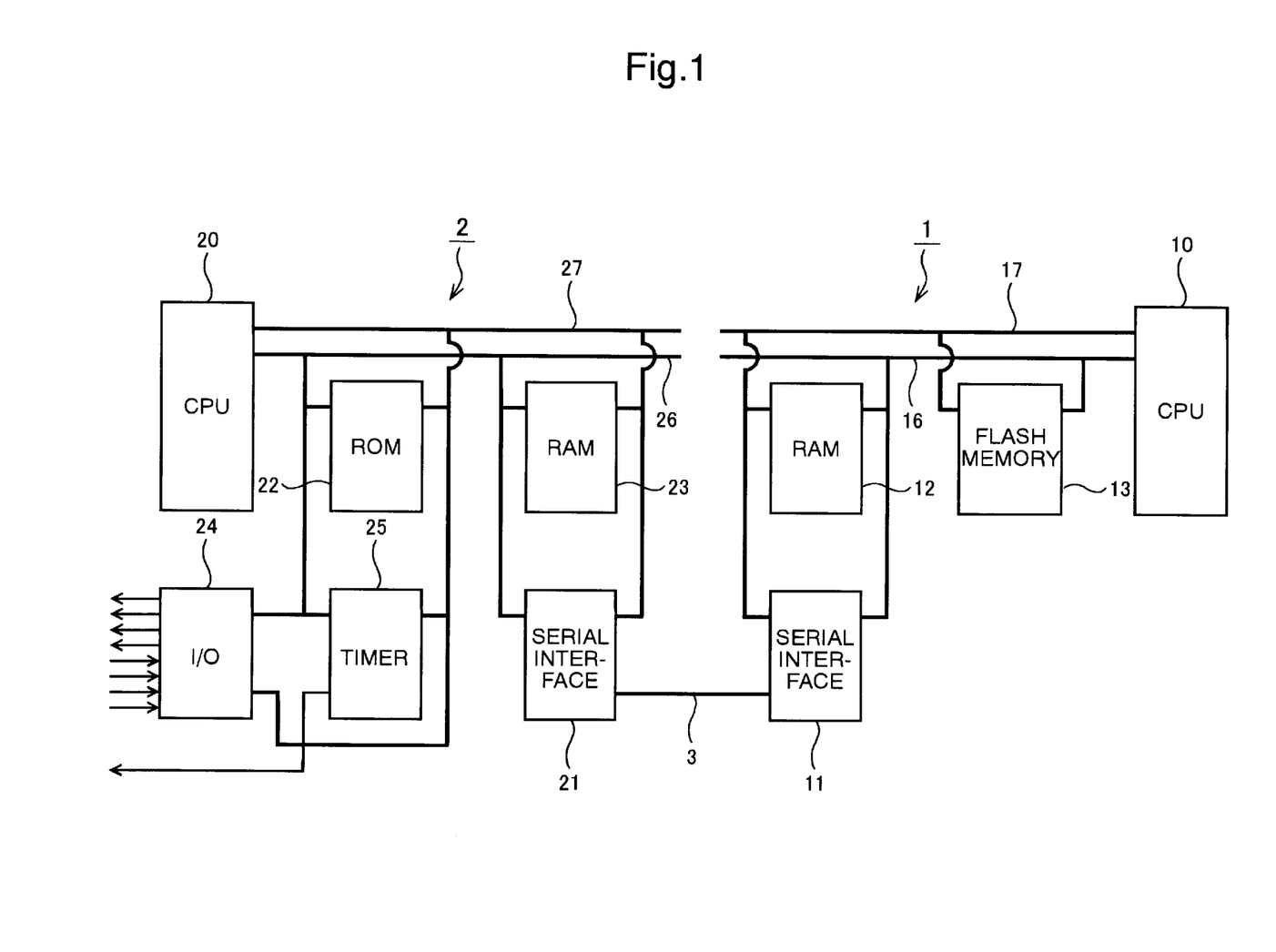
FIG. 1 is a circuit diagram of a test apparatus and a subject test board, which constitute a circuit board test system according to an embodiment of the present invention.
Figure 2:
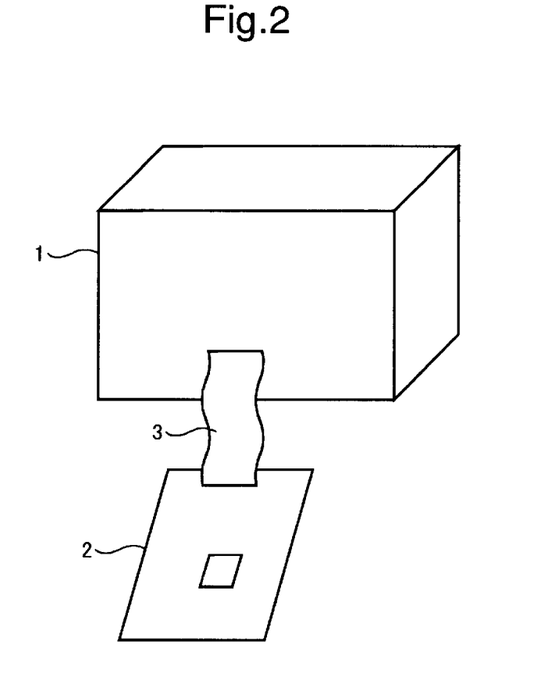
FIG. 2 is a perspective view illustrating the test apparatus and the subject test board, which are connected to each other.

FIG. 2 is a perspective view illustrating a test apparatus 1 and a subject test board 2, which constitute a circuit board test system according to the present invention, while FIG. 1 is the circuit diagram thereof. As shown in FIG. 2, the subject test board 2 is connected to the test apparatus 1 via a flat cable 3. As shown in FIG. 1, the test apparatus 1 and the subject test board 2 are provided with serial interfaces 11, 21, respectively, to be connected to each other via the flat cable 3.

In the subject test board 2, the serial interface 21 is connected to a CPU 20 via a data bus 26 and an address bus 27. The CPU 20 is also connected to each of the circuit blocks such as a ROM 22, RAM 23, and an I/O port 24 via the data bus 26 and the address bus 27.

The serial interface 21, which corresponds to a command receiver part, receives a test command from the test apparatus 1 and sends response data as a test result to the test apparatus 1.

Figure 7:
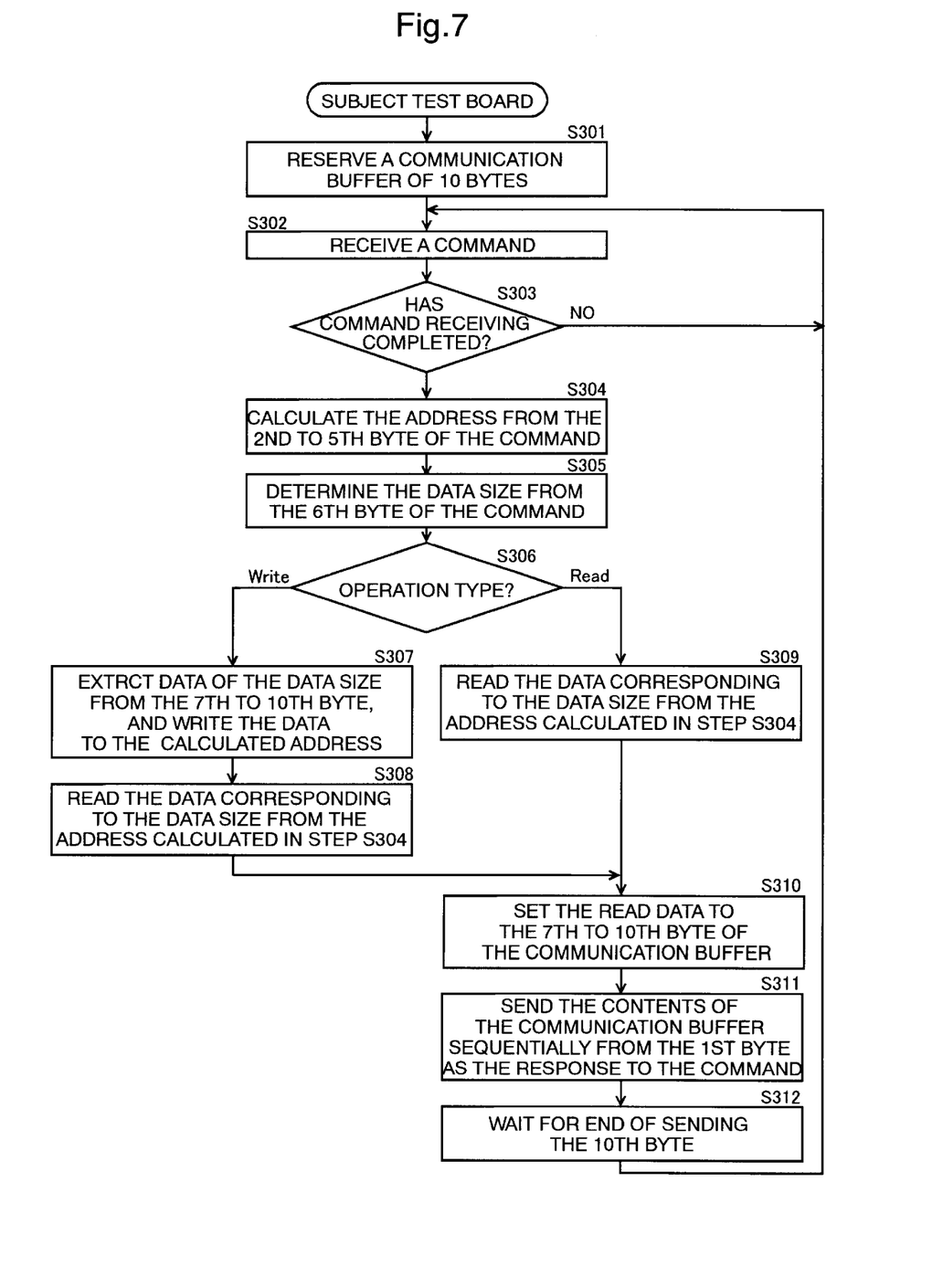
FIG. 7 is a flowchart showing an outline of the test program executed by the CPU on the subject test board.

The ROM 22, which corresponds to a storage part, stores a test program which is read by the CPU 20 to thereby allow the CPU 20 to execute the control shown in FIG. 7. The ROM 22 also stores other programs read by the CPU 20.

The CPU 20 is a control unit or controller which acts as a control part for reading and executing various programs stored in the ROM 22. According to this embodiment, employed to serve also for testing is the CPU 20 which is originally intended to implement the inherent functions (functions defined by specifications) of the subject test board 2. However, a CPU may be provided which is different from one for implementing the inherent functions and used only for testing. In the former case, the CPU 20 reads from the ROM 22 and then executes the aforementioned test program and other programs. In the latter case, the CPU 20 used only for testing reads and executes only the test program in the ROM 22.

The RAM 23 is a main storage device in which the work area of the CPU 20 is set aside. The RAM 23 (work area) is used for storing temporary data generated by the CPU 20.

A timer 25 is a hardware timer for measuring time used to implement the inherent functions of the CPU 20 and for generating time interval interrupts.

The I/O port 24 is an interface for capturing a signal from an external sensor or outputting a signal to control external LEDs and the like. In testing the circuit board 2, the output of I/O port 24 is connected to the CPU 10 of the test apparatus when necessary. And, the status of the output is monitored by the CPU 10.

Each circuit block on the subject test board 2 is assigned a physical address, while each physical address is associated by the CPU 20 with a logical address in the address space. That is, each circuit block on the subject test board 2 is mapped in the address space of the CPU 20 as shown in the memory map of FIG. 3. Thus, upon executing various programs, the CPU 20 recognizes each circuit block on the subject test board 2 as within the address space and then accesses the data of each circuit block in accordance with the logical address. In practice, the CPU 20 itself translates the logical address to the physical address, which is in turn provided (fed) to each circuit block. However, for simplicity, it is to be understood that the CPU 20 directly provides the logical address to each circuit block, and the logical address is simply referred to as an "address".

Upon writing data to each circuit block, the CPU 20 sends the subject write data to the data bus 26, while sending an address representative of the subject write position in the subject write circuit block to the address bus 27. Then, in the circuit block assigned to this address, the subject write data is written to the position designated by the address. Similarly, upon reading data from each circuit block, the CPU 20 sends an address representative of the storage position of the data to the address bus 27. In the circuit block assigned to this address, this causes the subject read data to be read from the position designated by the address.

On the other hand, in the test apparatus 1, the serial interface 11 is connected to a CPU 10 via a data bus 16 and an address bus 17. The CPU 10 is further connected to each circuit block such as a RAM 12 and a flash memory 13 via the data bus 16 and the address bus 17.

The serial interface 11 which corresponds to a command transmitter part sends a test command to the subject test board 2 and receives response data as a test result from the subject test board 2.

Figure 4:
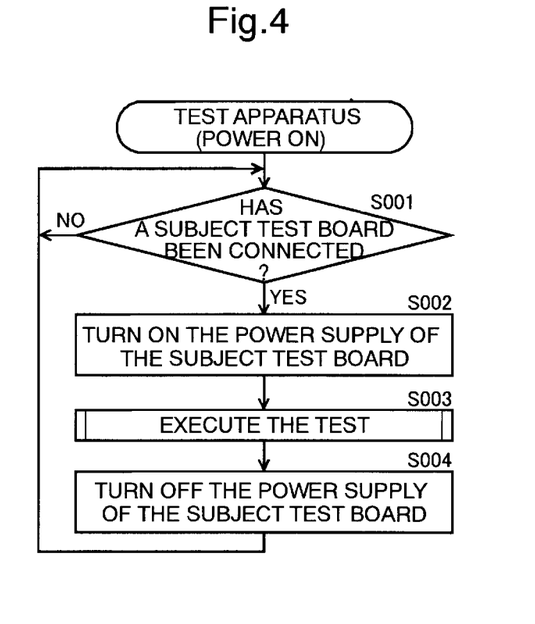
FIG. 4 is a flowchart showing the main routine of a test program to be performed by the CPU of the test apparatus.
Figure 5:
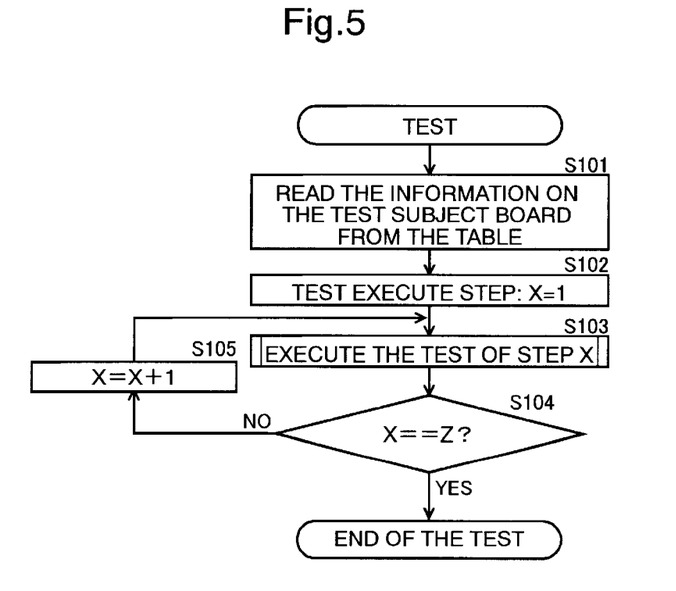
FIG. 5 is a flowchart showing a test processing subroutine to be executed in step S003 of FIG. 4.
Figure 6:
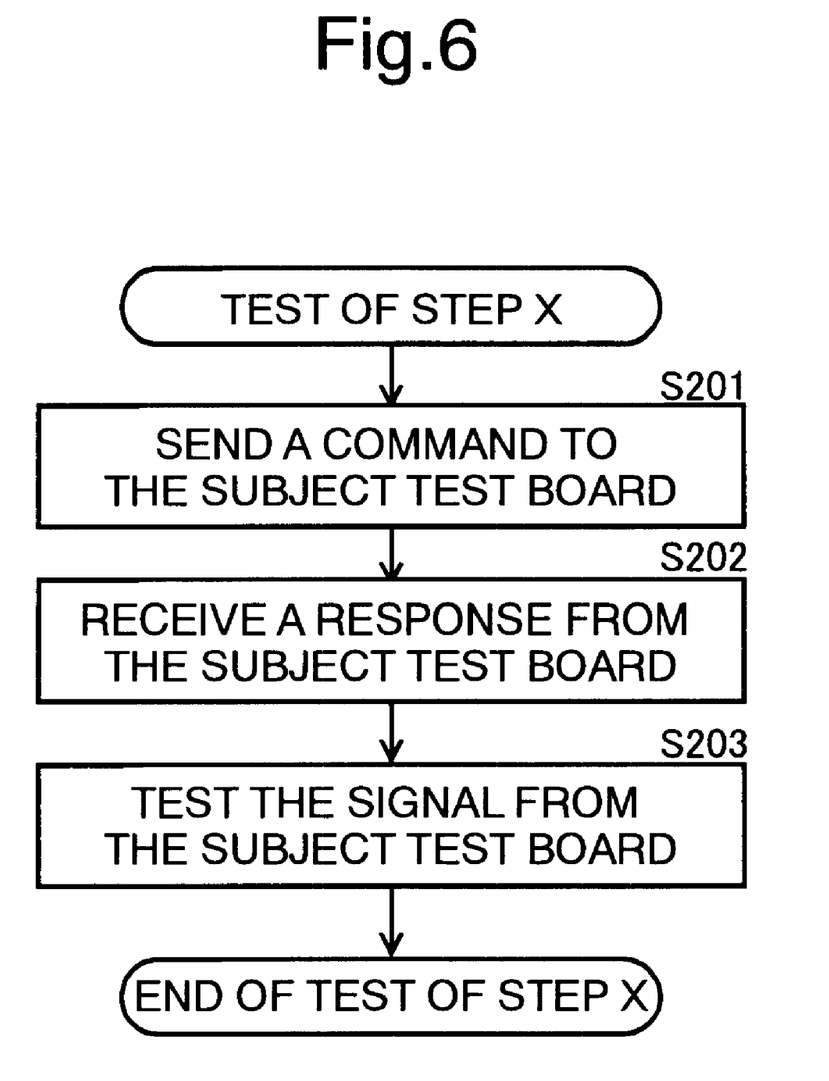
FIG. 6 is a flowchart showing a test processing subroutine of step X to be executed in step S103 of FIG. 5.

The flash memory 13 is a re-programmable memory which stores a test program that is read by the CPU 10 to thereby allow the CPU 10 to execute the control shown in FIGS. 4 to 6. The flash memory 13 also stores a reference table shown in FIG. 8, which is referenced by the CPU 10 being executing the test program.

The CPU 10 is a controller which acts as a command generator part for reading and executing the test program stored in the flash memory 13.

The RAM 12 is a main storage device in which the work area of the CPU 10 is set aside. The RAM 12 (work area) is used for storing temporary data generated by the CPU 10.

General Description on the Test

Now, the general test procedure will be explained below which is carried out between the test apparatus 1 and the subject test board 2, which are provided with the aforementioned hardware configurations. In this embodiment, the test program prepared on the subject test board 2 (a test program stored on the ROM 22) is to write some data to the position designated by an address or to read data present at the position designated by an address. In other words, the test program is provided with generalized contents of the test steps S503_1 to S503_z in the conventional test processing shown in FIG. 11. Accordingly, it is necessary for test commands provided from the test apparatus 1 to the subject test board 2 to include the designation of the type of data operation (read or write), the designation of an address for indicating a data read or write position, and subject read data for a write type of data operation.

Figure 9A:
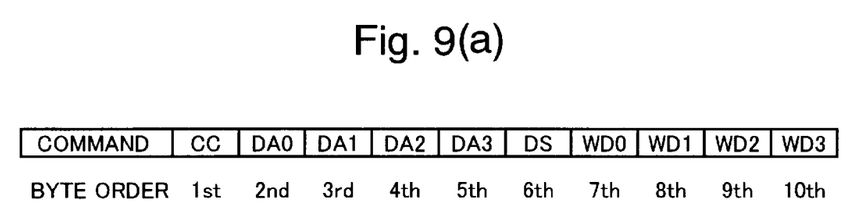

FIG. 9(a) shows a format illustrating the test commands. As shown in FIG. 9(a), from the leading byte, the test commands include Command Code (CC) for designating the type of data operation; Data Address (DA0 to DA3) of four bytes for designating read and write addresses; Data Size (DS) for designating the size of the data to be written or read for testing; and Write Data (WD0 to WD3) containing the test subject write data of the size designated by the DS which is written to DA0 to DA3 when writing is designated by the CC. The CC is set to "W" when writing is required and "R" when reading is required. The DS takes on a value of "B" for a data size of one byte, "W" for two bytes, and "L" for four bytes. The WD0 to WD3 are neglected when reading is designated by the CC.

When the CPU 20 of the subject test board 2 has received a test command with the CC of value "W" from the test apparatus 1, the CPU 20 reads data of the size designated by a DS from the WD0 to WD3 and writes the data to the position designated by the DA0 to DA3. When the data has been written to a circuit block, for example, to the I/O port 24, the written data causes an operation of an output device (such as an LED) which operates in accordance with the output from the I/O port 24. Thus, this makes it possible for an tester (an operator of the test apparatus) to check if the subject test board 2 works properly, in accordance with a determination of whether the operation of the output device follows the data included in the test command. In addition, the CPU 20 reads again the data that has been once written and then sends the data to the test apparatus 1 as response data. Thus, this makes it possible for the tester to check if the subject test board 2 works properly, in accordance with a determination of whether the data included in the response data is the same as that included in the test command. Furthermore, when a value of "R" is designated by the CC of the test command, the CPU 20 reads the data of the size designated by the value of the DS from the position designated by the DA0 to DA3 and then sends the data to the test apparatus 1 as response data. Accordingly, the tester can designate the position, where a pre-calculated checksum in the ROM 22 is stored, by the test command of DA0 to DA3 to obtain the checksum. Then, the tester can check if the subject test board 2 works properly, in accordance with the checksum.

Figure 9B:
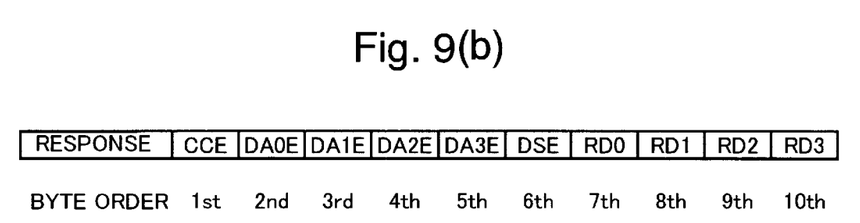

FIG. 9(b) is a view of the format illustrating the response data. As shown in FIG. 9(b), from the leading byte, the response data include Command Code Echo (CCE) for storing the same value as that of the CC of a test command and checking a command; Data Address Echo (DAE0 to DAE3) for storing the same value as that of the DA1 to DA3 of a test command and for checking an address; Data Size Echo (DSE) for storing the same value as that of the DS of a test command and for checking a data size; and Read Data (RD0 to RD3) for holding the test subject read data designated by the DA0 to DA3 and DS of a test command.

As described above, the CPU 20 of the subject test board 2 identifies a subject test position in accordance with the DA0 to DA3 included in the test command that has been sent from the test apparatus 1, executes the test, and then sends back the resulting response data to the test apparatus 1. For this reason, the test program stored in the ROM 22 of the subject test board 2 allows the CPU 20 to execute tests on various circuit blocks. Thus, only one test program can be prepared to be sufficiently applied to the subject test board 2 of a plurality of types with various configurations and will not have to be modified to be applied to the subject test board 2 of which configuration has been altered.

Figure 8:
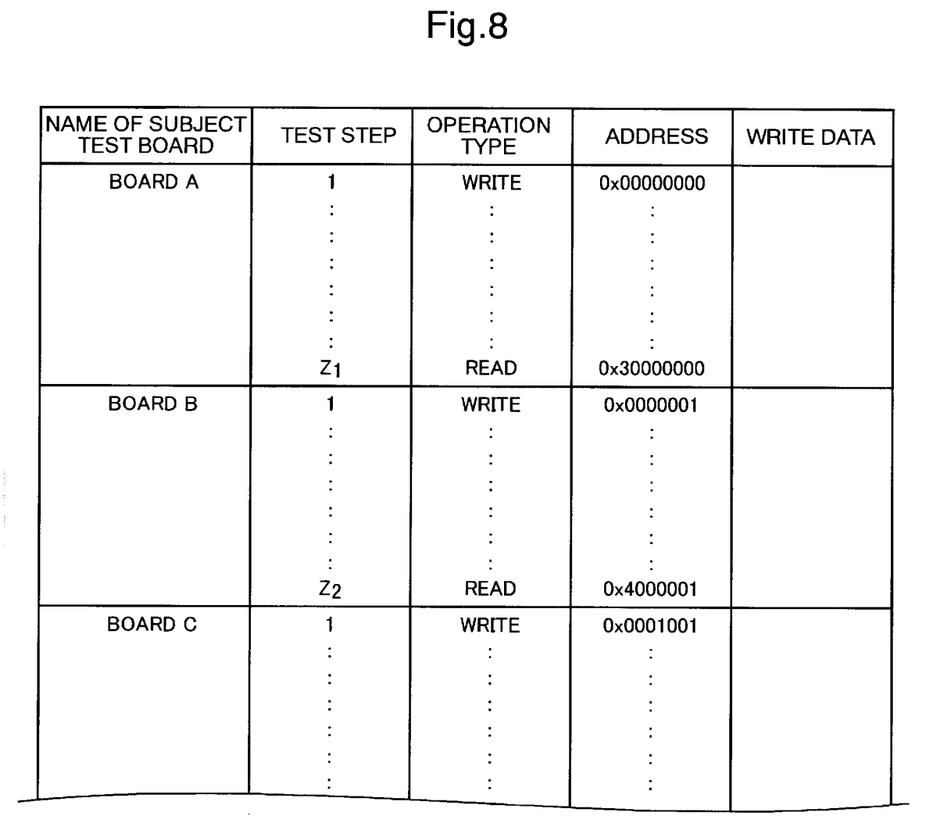
FIG. 8 is a table showing the configuration of a reference table.

On the other hand, the CPU 10 of the test apparatus 1 must generate test commands in accordance with the configuration of the subject test board 2. For this purpose, in the flash memory 13, the reference table of FIG. 8 is prepared. As shown in FIG. 8, the reference table is provided, for each kind of subject test board 2 to be tested, with a list of the type of operation (corresponding to the CC of a test command) in a series of test steps for testing the subject test board 2, an address (corresponding to the DA0 to DA3 of a test command), and subject write data (corresponding to the WD0 to WD3 of a test command). The CPU 10 of the test apparatus 1 reads sequentially the operation type and address of each of the test steps (and subject write data for a operation type of writing), which are listed in the columns each corresponding to the name of a subject test board 2 that is connected to the test apparatus 1 via the flat cable 3. Then, the CPU 10 sends the test command generated in accordance therewith to the subject test board 2. Thus, when a subject test board 2 is additionally to be tested, what must be done is only to additionally register the information corresponding to the added subject test board 2 to the reference table. Furthermore, suppose the test contents of a subject test board 2 that has been already registered to the reference table are altered or added, or the hardware configuration of the subject test board 2 is changed. Even in these cases, what must be done is only to modify the contents of the information that has been already registered on the reference table.

Contents of Processing

Now, specifically explained below will be the contents of a test program to be executed by the CPU 10 of the test apparatus 1 and the contents of a test program to be executed by the CPU 20 of the subject test board 2.

When a main power supply is turned on, the CPU 10 of the test apparatus 1 initiates the main routine of the test program, shown in FIG. 4. Then, in the first step S001 after the initiation, the CPU 10 waits until a subject test board 2 is connected to the tip of the serial interface 11 via the flat cable 3. When the subject test board 2 has been connected, the CPU 10 causes power to be supplied to the subject test board 2 via the flat cable 3 in step S002.

In the subsequent step S003, the CPU 10 executes the test on the subject test board 2. FIG. 5 is a view illustrating the flowchart of the test subroutine to be executed in the step S003. In the first step S101 of this subroutine, the CPU 10 reads all information regarding the subject test board 2 from the reference table.

Then, in the subsequent step S102, the CPU 10 sets a default "1" to variable X, which is representative of a test execute step. Then, the CPU 10 executes sequentially each of the test steps in the loop from step S103 to S105 in accordance with the information regarding the subject test board 2, which has been read from the reference table. In the first step S103 of this loop, the CPU 10 executes the test of step X. FIG. 6 is a view illustrating the test processing subroutine of step X to be executed in this step S103. In the first step of the subroutine, the CPU 10 extracts the operation type and address related to the test step X (and subject write data for a operation type of writing) from the information regarding the subject test board 2, which has been read from the reference table. Then, the CPU 10 generates a test command in accordance with the operation type and address, which have been extracted, and then sends the test command to the subject test board 2.

In the subsequent step S202, the CPU 10 waits for response data that the subject test board 2 will send to the CPU 10 in response to the test command sent in step S201. Then, after the CPU 10 has received the response data from the subject test board 2, control proceeds to step S203.

In step S203, the CPU 10 carries out tests on the signal received from the subject test board 2 in step S202 in the aforementioned manner. After the tests have been completed, the CPU 10 stores temporarily the test results in the RAM 12, and then control exits the test processing subroutine of step X and returns to the routine of FIG. 5.

In the routine of FIG. 5, the CPU 10 allows control to proceed from step S103 to S104. In this step S104, the CPU 10 checks if the variable X has reached the maximum value Z of the test steps for the subject test board 2, which has been read from the reference table. If the variable X has not reached the maximum value Z, the CPU 10 increments the variable X by one in step S105 and then allows control to return to step S103 to execute the following test step. When the loop processing from step S103 to S105 has been repeated to cause the variable X to reach the maximum value Z, the CPU 10 allows control to exit from the test subroutine and return to the main routine of FIG. 4.

In the main routine of FIG. 4, the CPU 10 allows control to proceed from step S003 to S004. In the step S004, the CPU 10 interprets that all test steps have been completed, and then shuts down the power supplied to the subject test board 2. Then, the CPU 10 allows control to return to S001, where the CPU 10 waits until a new subject test board 2 is connected to the tip of the serial interface 11.

On the other hand, the CPU 20 of the subject test board 2, the power supply to which has been turned on in step S002, initiates the processing shown in FIG. 7 in accordance with the test program. In the first step S301 after the initiation, the CPU 20 reserves an area of 10 bytes as a communication buffer within the RAM 23.

Then, in step S302, the CPU 20 waits for a test command to be sent from the test apparatus 1. When the test command has been sent, it is checked in the following step S303 if the CPU 20 has received all the test command (10-byte data) that had been sent thereto. If not, the CPU 20 allows control to return to S302. If the CPU 20 has received the test command, control proceeds to step S304.

In step S304, the CPU 20 calculates the designated address based on the value of the second to fifth byte (DA0 to DA3) of the received test command.

In the following step S305, the CPU 20 determines the size of the data, which is to be processed, based on the sixth byte (DS) of the received test command.

In the following step S306, the CPU 20 determines whether writing or reading is designated as the type of data operation, based on the first byte (CC) of the received test command. Then, the CPU 20 allows control to proceed to step S307 if writing is designated as the type of data operation and to step S309 if reading is designated.

In step S307, the CPU 20 extracts the data of the size determined in step S305 from the seventh to tenth byte (WD0 to WD3) of the received test command and then writes the extracted data to the position designated by the address provided through the calculation in step S304.

In the following step S308, the CPU 20 reads the data of the size determined in step S305 from the position designated by the address provided through the calculation in step S304. After the step S308 has been completed, the CPU 20 allows control to proceed to step S310.

On the other hand, in step S309, the CPU 20 reads the data of the size determined in step S305 from the position designated by the address provided through the calculation in step S304. After the step S309 has been completed, the CPU 20 allows control to proceed to step S310.

In step S310, the CPU 20 sets the data that has been read in step S308 or S309 to the seventh to tenth bytes of the communication buffer that has been reserved in step S301. Incidentally, the contents of the received test command are copied without being processed to the first to sixth bytes of the communication buffer.

In the following step S311, as the response data corresponding to the received test command, the CPU 20 sends the contents of the communication buffer in sequence from the first byte to the test apparatus 1. After the first to tenth bytes of the response data have been sent as such, the CPU 20 allows control to return from step S312 to S302, where the CPU 20 waits for the next test command to be sent from the test apparatus 1.

The CPU 20 of the subject test board 2 repeatedly executes the aforementioned loop from step S302 to S312 until the main power supply is shut down in step S004.

Action of Embodiment

Figure 10:
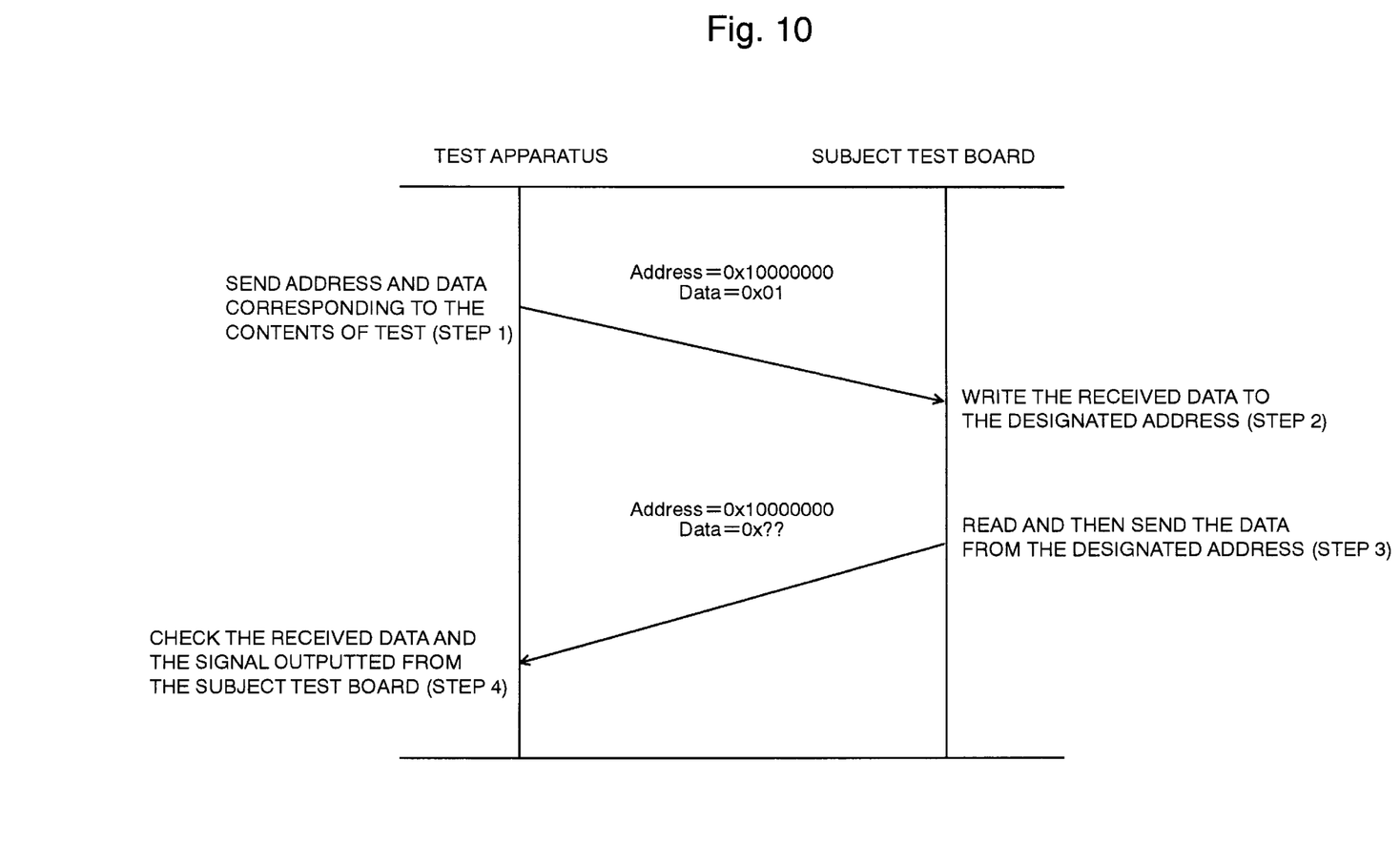
FIG. 10 is a sequence diagram illustrating information to be communicated between the test apparatus and the subject test board.

An example of testing the subject test board 2 using the circuit board test system according to this embodiment, which has the aforementioned configuration, will be explained below with reference to the sequence diagram of FIG. 10.

Figure 3:
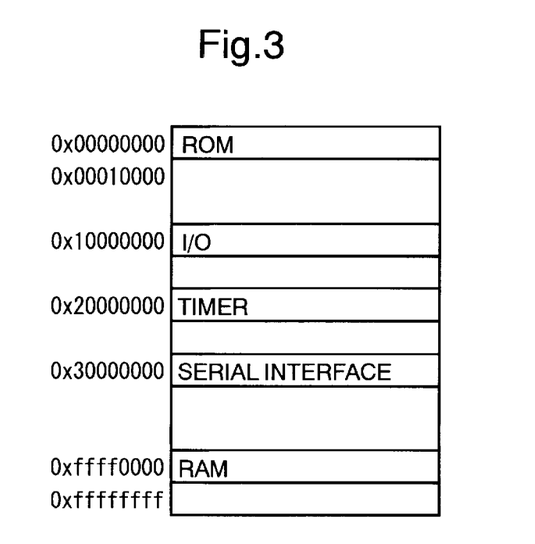
FIG. 3 is a view illustrating an address map of logical addresses assigned to each of the circuit blocks implemented on the subject test board.

Now, suppose such a test is to be carried out on a particular subject test board 2 in test step 1 that an output of a 5V level is generated from the bit 0 of the I/O port 24, which has been mapped to the address "0x10000000" in the memory map shown in FIG. 3. In this case, the CPU 10 of the test apparatus 1 reads the information regarding the subject test board 2 in the reference table and corresponding to the test step 1, that is, the operation type=writing, address=0x10000000, and data=0x01 (corresponding to a signal level of 5V). Then, the CPU 10 generates a test command in accordance with the information that has been read and then sends the test command to the subject test board 2 (Step 1). Then, the CPU 20 of the subject test board 2 interprets the CC="W" as an instruction to write the data "0x01" to the address "0x10000000", thus writing the data "0x01" to the address "0x10000000" (Step 2). Subsequently, the CPU 20 reads the data from the same address "0x10000000" and then sends the data to the test apparatus 1 as the response data (Step 3). The CPU 10 of the test apparatus 1 compares the received response data and the output from the bit 0 of the I/O port 24 with the data "0x01" transmitted and included in the test command to check if the former corresponds with the latter (Step 4). This makes it possible to determine that the subject test board 2 works properly if the former corresponds with the latter.

In addition, suppose the test of the test step 2 to be carried out on the subject test board 2 is to read the checksum stored in a particular position of the ROM 22. In this case, the CPU 10 of the test apparatus 1 reads the information regarding the subject test board 2 in the reference table and corresponding to the test step 2, that is, the operation type=reading and address=the address of the particular position. Then, the CPU 10 generates a test command in accordance with the information that has been read and then sends the test command to the subject test board 2. Then, the CPU 20 of the subject test board 2 interprets the CC="R" as an instruction to read data from the designated address, thus reading the data from the address and then sending the data to the test apparatus 1 as the response data. The CPU 10 of the test apparatus 1 determines whether the subject test board 2 works properly, in accordance with a determination of whether the received response data has a predetermined value.

As described above, according to the circuit board test system of this embodiment, it is not necessary to provide the subject test board 2 with a multiple of processing modules corresponding to specific test contents. On the contrary, the subject test board 2 may be only provided with a single test program that is designed to execute data operation in accordance with the designated contents at the designated address. Then, the test apparatus sends a test command for designating the operation type, operation subject address, and operation subject data in accordance with the registered contents of the reference table, thereby allowing the CPU 20 of the subject test board 2 being executing test program codes to execute the desired test. Thus, it is made possible to flexibly cope with a change in hardware configuration or the like of the subject test board 2.

According to the circuit board test system of the present invention configured as described above, it is possible to provide a reduced size for a test program and flexibly cope with a change in test item.

While there has been described what are at present considered to be preferred embodiment of the present invention, it will be understood that various modifications may be made thereto, and it is intended that the appended claims cover all such modifications as fall within the true spirit and scope of the invention.

The present disclosure relates to subject matter contained in Japanese Patent Application No. 2000-133120 (filed on May 2, 2000) which is expressly incorporated herein by reference in its entirety.

We claim:

1. A circuit board test system including a subject test board having a controller and circuits mapped in an address space of said controller and implemented thereon, and a test apparatus for issuing a test command to the subject test board, said test apparatus comprising a command generator that generates the test command which specifies an address in said address space and an operation to be performed to the address, and a command transmitter that sends the test command generated by the command generator to said subject test board, said subject test board comprising a command receiver that receives said test command, the controller, and a storage that stores a program to allow said controller to receive said test command via said command receiver and to perform the operation specified by the test command to the address specified by the test command.

2. The circuit board test system according to claim 1, wherein said command generator in said test apparatus generates the test command which specifies an address in said address space and which specifies data with which a write operation is to be performed to the address.

3. The circuit board test system according to claim 2, wherein the program stored in said storage in said subject test board, when the test command specifying the data with which the write operation to be performed is received, allows said controller to write data specified by the test command to the address specified by the test command and to then read the data from the address specified by the test command.

4. The circuit board test system according to claim 3, wherein the program stored in said storage in said subject test board allows said controller to send the data having been read to said test apparatus.

5. The circuit board test system according to claim 1, wherein said command generator in said test apparatus generates the test command which specifies an address in said address space and specifies that the operation to be performed is a read operation.

6. The circuit board test system according to claim 5, wherein the program stored in said storage in said subject test board allows said controller to send the data having been read to said test apparatus.

7. A circuit board having a controller and circuits mapped in an address space of said controller and implemented thereon, comprising a command receiver that receives a test command specifying an address in said address space and that receives an operation to be performed to the address, and a storage that stores a program to allow said controller to receive the test command via said command receiver and to perform the operation specified by the test command to the address specified by the test command.

* * * * *